United States Patent
Mourant et al.

(10) Patent No.: US 8,604,879 B2
(45) Date of Patent: Dec. 10, 2013

(54) MATCHED FEEDBACK AMPLIFIER WITH IMPROVED LINEARITY

(75) Inventors: Jean-Marc Mourant, Dunstable, MA (US); Feng-Jung Huang, San Antonio, TX (US); Ran Li, Winchester, MA (US); Chuying Mao, Chelmsford, MA (US)

(73) Assignee: Integrated Device Technology Inc., San Jose, CA (US)

(*) Notice: Subject to any disclaimer, the term of this patent is extended or adjusted under 35 U.S.C. 154(b) by 40 days.

(21) Appl. No.: 13/435,455

(22) Filed: Mar. 30, 2012

(65) Prior Publication Data

US 2013/0257537 A1    Oct. 3, 2013

(51) Int. Cl.
*H03F 3/45* (2006.01)
*H03F 1/14* (2006.01)

(52) U.S. Cl.
USPC .......................... 330/260; 330/292

(58) Field of Classification Search
USPC ........................ 330/252, 260, 292
See application file for complete search history.

(56) References Cited

U.S. PATENT DOCUMENTS

| 5,917,379 | A  | * | 6/1999 | Ashby et al. ............. 330/260 |
| 7,345,548 | B2 | * | 3/2008 | Rivoirard et al. ......... 330/311 |
| 8,456,237 | B2 | * | 6/2013 | Huang et al. ............. 330/282 |

* cited by examiner

*Primary Examiner* — Steven J Mottola
(74) *Attorney, Agent, or Firm* — Tracy Parris

(57) ABSTRACT

An impedance-matched amplifier utilizing a feed-forward linearization technique involving multiple negative feedbacks and distortion compensation without active tail current sources reduces noise, distortion, power consumption and heat dissipation requirements and increases linearity, dynamic range, signal-to-noise-ratio, sensitivity and quality of service. Some differential amplifier embodiments of the invention consume less than 2 mA at 5 Volts or 10 mW power consumption per 1 mW in peak and sustained output IP3 performance above 40 dBm. In contrast, for an input signal frequency of 200 MHz, a 16 dB gain state-of-the-art differential amplifier consumes 100 mA at 5 Volts with a peak output IP3 of 36 dBm while an implementation of a 16 dB gain differential amplifier embodying the invention consumes 77.7 mA at 5 Volts with a peak output IP3 of 46 dBm and sustained at or above 40 dBm over a wide frequency range.

20 Claims, 3 Drawing Sheets

MATCHED FEEDBACK AMPLIFIER WITH IMPROVED LINEARITY

CROSS-REFERENCE TO RELATED APPLICATIONS

This application is related to U.S. Pat. No. 8,456,237, entitled "Low Noise Variable Gain Amplifier Utilizing Variable Feedback Techniques with Constant Input/Output Impedance," which is hereby incorporated by reference in its entirety as if fully set forth herein.

TECHNICAL FIELD

The present invention generally relates to amplification. More particularly, the invention relates to low noise, impedance-matched amplification.

BACKGROUND

Conventional differential feedback amplifiers suffer one or more problems, including relatively high power consumption, relatively narrow dynamic range, relatively low linearity and a lack of matched input and output impedances requiring additional impedance matching circuitry. Attempts to compensate for these problems often exacerbate other problems.

FIG. 1 illustrates an exemplary conventional differential feedback amplifier with compensation disclosed in U.S. Pat. No. 4,835,488, entitled, Wideband Linearized Emitter Feedback Amplifier." Conventional amplifier 100 comprises main amplifier 110 and compensation amplifier 120. Main amplifier 110 comprises bipolar transistors QMP1, QMP2, emitter feedback resistor RME, load resistors RL1, RL2 and active tail current sources IM1, IM2. Compensation amplifier comprises bipolar transistors QCP1, QCP2, emitter feedback resistor RCE, input resistors RB1, RB2 and active tail current sources IC1, IC2. Differential input INA, INB is coupled to the respective input terminals of input signal source VIN, the differential input of main amplifier 110, i.e., the base of transistors QMP1, QMP2, and to compensation amplifier 120 input resistors RB1, RB2. Differential output OUTA, OUTB is coupled to the differential output of main amplifier 110, i.e., collectors of main transistors QMP1, QMP2, the differential output of compensation amplifier 120, i.e., collectors of compensation transistors QCP1, QCP2, as well as respective load resistors RL1, RL2. Active tail current sources IM1, IM2 are coupled to respective emitters of main transistors QMP1, QMP2. Active tail current sources IC1, IC2 are coupled to respective emitters of compensation transistors QCP1, QCP2. Designed to remove distortion, differential current generated by compensating amplifier 120 is subtracted from differential current generated by main amplifier 110, which is reflected in differential current through and voltage across load resistors RL1, RL2.

Main amplifier 110 and compensation amplifier 120 share the same feedback structure, although values vary. Each of main amplifier 110 and compensation amplifier 120 also share the same active tail current source structure, although values vary. Further, main amplifier 110 has load resistors RL1, RL2 while compensation amplifier 120 has input resistors RB1, RB2. While each of these features of conventional amplifier 100 were designed to solve problems, each introduces or exacerbates other problems.

For example, while input resistors RB1, RB2 are designed to increase the resistance of each base of compensation transistors QCP1, QCP2 to compensate for differences in the products of the base resistances and emitter-to-emitter capacitances of main transistors QMP1, QMP2 and compensation transistors QCP1, QCP2. Such differences adversely affect linearity at higher frequencies. However, compensation provided by input resistors RB1, RB2, is limited due to the inherent low pass RC filter characteristics created. As another example, main and compensation active tail current sources IM1, IM2, IC1, IC2, cause poor noise performance. In addition, since conventional amplifier 100 has high input impedance and since output impedance is defined by load resistors RL1, RL2, additional circuits are usually required to achieve input and output impedance matching. Still further, conventional amplifier 100 has relatively high power consumption. These problems are typical in conventional amplifiers. Thus, there is a need for a low noise, matched impedance feedback amplifier that improves linearity while reducing power consumption.

SUMMARY

This Summary is provided to introduce concepts in a simplified form. These concepts are described in greater detail below in the sections with accompanying figures entitled Detailed Description Of Illustrative Embodiments, Brief Description of the Drawings, Claims and in FIGS. 2-6. This Summary is not intended to identify key or essential features of the described or claimed subject matter, nor limit the scope thereof.

Linearity is improved and power consumption is reduced in a low noise, impedance matched amplifier by using a feed-forward linearization technique involving negative feedbacks and distortion compensation without active tail current sources. This technique provides low power requirements, low distortion, e.g., third-order intermodulation (IM3), and high linearity, e.g., output third order intercept point (i.e., IP3 or TOI), resulting in high signal-to-noise ratio (SNR) and high quality of service (QoS). Devices and equipment, such as radio frequency (RF) to intermediate frequency (IM) mixers in cellular base station equipment in the field of wireless communication, that utilize amplifiers implementing these high linearity, low-distortion, low-power amplification techniques may simultaneously improve their sensitivity, dynamic range, power consumption, heat dissipation, volume and packaging.

A device in accordance with an embodiment of the invention may comprise, for example, a single-ended or differential impedance-matched main amplifier having multiple negative feedbacks coupled to the output of a low-gain distortion compensation amplifier having at least one negative feedback. Neither amplifier has an active tail current source. The compensation may consist of generating and subtracting distortion from the main amplifier. Both the main amplifier and compensation amplifier may have negative feedback in the form of one or more emitter degeneration components, such as a resistor or inductor. The main amplifier may have an additional negative feedback coupled between its input and output. Negative feedback and/or bias current may be variable to further increase linearity and dynamic range. Each amplifier may comprise one or more transistors, e.g., single or Darlington BJT, FET, where the main and compensation amplifiers are coupled accordingly to subtract distortion. The compensation amplifier may be biased by the main amplifier, e.g., with direct coupling between bases, or may be biased independent of the main amplifier, e.g., using a DC blocking capacitor between bases. Direct coupling involves a simple circuit configuration and provides broader bandwidth. Independent biasing from main amplifier can enable independent bias control for main and compensation amplifier. Cross-coupled capacitors and/or pull-up chokes may also improve performance. Cross-coupled capacitors may further improve linearity at higher frequency. Pull-up chokes may improve output signal swing.

Differential amplifiers in accordance with the invention provide substantial performance improvements over state-of-the-art amplifiers. In contrast with state-of-the-art conventional amplifiers, some differential amplifiers embodying the invention consume less than 2 mA at 5 Volts or 10 mW power consumption per 1 mW in peak and sustained output IP3 performance at over 40 dBm. For example, for an input signal frequency of 200 MHz, a 16 dB gain state-of-the-art differential amplifier consumes 100 mA at 5 Volts with a peak output IP3 of 36 dBm while an implementation of a 16 dB gain differential amplifier embodying the invention consumes 77.7 mA at 5 Volts with a peak output IP3 of 46 dBm and sustained 40+dBm over a wide frequency range of 50 to 640 MHz. Conventional amplifiers cannot achieve this power consumption to peak and sustained performance ratio over 40 dBm.

BRIEF DESCRIPTION OF THE DRAWINGS

The foregoing summary, as well as the following detailed description, is better understood when read in conjunction with the accompanying drawings. The accompanying drawings, which are incorporated herein and form part of the specification, illustrate a plurality of embodiments of the present invention and, together with the description, further serve to explain the principles involved and to enable a person skilled in the relevant art(s) to make and use the disclosed technologies. However, embodiments of the invention are not limited to the specific implementations disclosed herein. Each figure represents a different embodiment rather than a different view of the same embodiment. Similarities between portions of embodiments are indicated by use of the same references for particular components.

DETAILED DESCRIPTION OF ILLUSTRATIVE EMBODIMENTS

Figure 1:
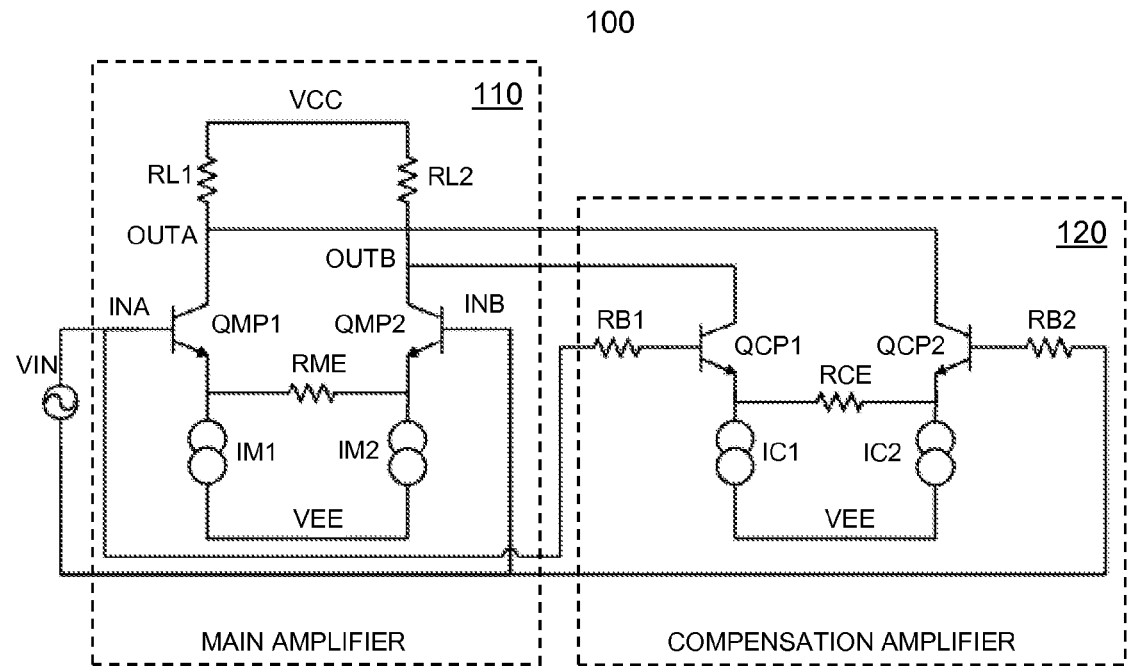
FIG. 1 illustrates an exemplary conventional differential feedback amplifier with compensation.

Reference will now be made to embodiments of the invention, examples of which are illustrated in the accompanying drawings. While the technology will be described in conjunction with various embodiments, it will be understood that the embodiments are not intended to limit the present technology. On the contrary, the present technology is intended to cover alternatives, modifications, and equivalents, which may be included within the spirit and scope the various embodiments as defined herein, including by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

References in the specification to "embodiment," "example embodiment," or the like, indicate that the embodiment described may include a particular feature, structure, characteristic or step, but every embodiment may not necessarily include the particular feature, structure, characteristic or step. Moreover, such phrases are not necessarily referring to the same embodiment. Furthermore, when a particular feature, structure, or characteristic is described in connection with an embodiment, it is submitted that it is within the knowledge of one skilled in the art to implement such feature, structure, or characteristic in connection with other embodiments whether or not explicitly described.

Unless specifically stated otherwise, terms such as "sampling," "latching," "determining," "selecting, "storing," "registering," "creating," "including," "comparing," "receiving," "providing," "generating," "associating," and "arranging", or the like, refer to the actions and processes of an electronic device that manipulates and transforms data represented as physical (electronic) quantities within the electronic device. The terms "logic," "function," "step," and the like refer to functionality that may be implemented by hardware (digital and/or analog) or a combination of hardware, software and/or firmware. Unless specifically indicated, described and claimed functionality may be implemented by hardware (digital and/or analog) or a combination of hardware, software and/or firmware. The term "programmable" and the like refer to functionality permitting definition or selection of functionality to vary performance of logic from one embodiment to the next, whether one-time or any number of times such as by reprogrammable functionality.

Certain terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection or though an indirect electrical connection through other components, devices and connections. Furthermore, the term "information" is intended to refer to any data, instructions, or control sequences that may be communicated between components of a device. For example, if information is sent between two components, data, instructions, control sequences, or any combination thereof may be sent between the two components.

Figure 2:
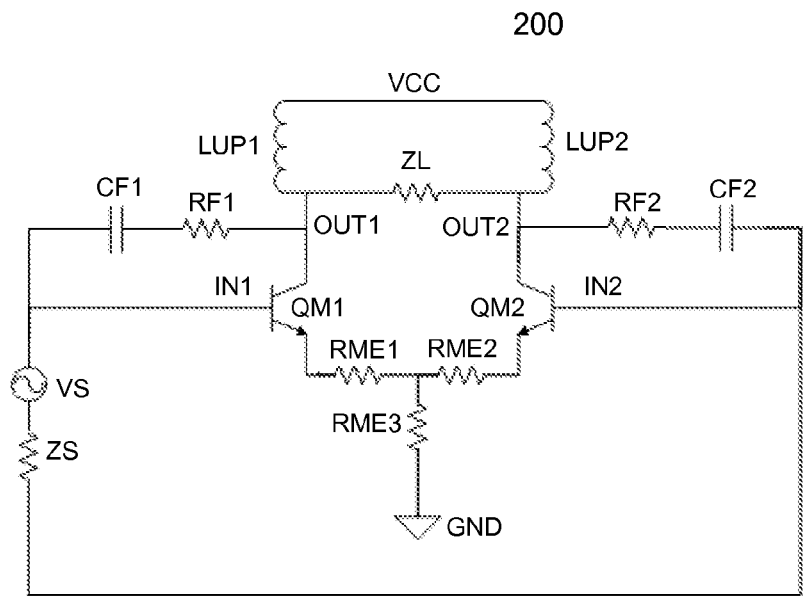
FIG. 2 illustrates an exemplary matched-impedance feedback amplifier design that can be used with compensation in accordance with an embodiment of the invention.

FIG. 2 illustrates an exemplary matched-impedance feedback amplifier design that can be used with compensation in accordance with an embodiment of the invention. In the illustrated embodiment, differential feedback amplifier 200 comprises first main transistor QM1, second main transistor QM2, first series-coupled feedback capacitor CF1 and feedback resistor RF1, second series-coupled feedback capacitor CF2 and feedback resistor RF2, first main emitter feedback resistor RME1, second main emitter feedback resistor RME2, main emitter current-limiting resistor RME3, first pull-up choke LUP1 and second pull-up choke LUP2.

With regard to the architecture of differential feedback amplifier 200 illustrated in FIG. 2, differential feedback amplifier 200 comprises a single stage of amplification, although in other embodiments there may be additional input and/or output stages.

An input signal source VS having source impedance ZS is coupled between first and second differential inputs IN1, IN2. An output load having output impedance ZL is coupled between first and second differential outputs OUT1, OUT2. Input signal source VS may comprise, for example, a 50 to 500 MHz signal generated by an RF to IF downconverting mixer. Source impedance ZS may be, for example, 50 Ohms. Load impedance ZL may be, for example, 200 Ohms. Input and output impedance may be the same or different among various embodiments.

First main transistor QM1, and specifically a base terminal of this npn bipolar junction transistor (BJT), is coupled to first differential input IN1 while second main transistor QM2, and specifically the base terminal of this npn BJT, is coupled to second differential input IN2. First main transistor QM1, and specifically its collector terminal, is coupled to first differential output OUT1 while second main transistor QM2, and specifically its collector terminal, is coupled to second differential output OUT2.

First main transistor QM1, and specifically its emitter terminal, is coupled to a first terminal of first main emitter feedback resistor RME1 while second main transistor QM2, and specifically its emitter terminal, is coupled to a first terminal of second main emitter feedback resistor RME2. The second terminals of first and second main emitter feedback resistors RME1, RME2 are coupled together. First and second main emitter feedback resistors RME1, RME2 provide negative voltage feedback. Current limiting resistor RME3 is coupled between ground and the second terminals of first and second main emitter feedback resistors RME1, RME2. Ground GND may be signal ground, Earth ground, chassis ground or other ground and may also be referred to as common or return.

First series-coupled feedback capacitor CF1 and feedback resistor RF1 are coupled between first differential input IN1 and first differential output OUT1, which is also between the base and collector of first main transistor QM1. First series-coupled feedback capacitor CF1 and feedback resistor RF1 provide negative current feedback. Second series-coupled feedback capacitor CF2 and feedback resistor RF2 are coupled between second differential input IN2 and second differential output OUT2, which is also between the base and collector of second main transistor QM2. Second series-coupled feedback capacitor CF2 and feedback resistor RF2 provide negative current feedback. The value of first and second feedback capacitors CF1, CF2 may depend on the lowest operating frequency of differential feedback amplifier 200, where the lower the frequency, the larger the value.

First pull-up choke LUP1 is coupled between first differential output OUT1 and power supply VCC. Second pull-up choke LUP2 is coupled between second differential output OUT2 and power supply VCC. The value of pull-up chokes LUP1, LUP2 may depend on the lowest operating frequency of differential feedback amplifier 200, where the lower the frequency, the larger the value.

The forgoing components of differential feedback amplifier 200 may be coupled directly or indirectly, i.e. there may be additional components between connections in the differential amplifier shown in FIG. 1.

Regarding component types and values, the input and output impedances of differential feedback amplifier 200 are matched to the source impedance ZS and load impedance ZL through the current and voltage feedbacks of differential feedback amplifier 200. The gain, input impedance and output impedance may be simultaneously determined through proper selection of first and second series-coupled feedback resistors RF1, RF2 and first and second main emitter feedback resistors RME1, RME2.

First and second main transistors QM1, QM2 are each shown as a bipolar junction transistor (BJT) having a base, collector and emitter. However, in other embodiments, each of first and second main transistors QM1, QM2 can be a wide variety of devices, e.g., BJT or heterojunction bipolar transistor (HBT), a metal oxide field effect transistor (MOSFET) device, metal semiconductor field effect transistor (MESFET) device or other transconductor or transistor technology device. Such alternative devices may require alternative configurations other than the configuration illustrated in FIG. 2. In addition, each of first and second main transistors QM1, QM2 can be either a single device configuration or a multiple device configuration, such as a Darlington configuration. Although FIG. 2 illustrates each of first and second main transistors QM1, QM2 in a common emitter configuration, other embodiments may implement other configurations. In one embodiment, emitter area of a BJT implementation of first and second main transistors QM1, QM2 may be approximately 200 $\mu m^2$. Bias of first and second main transistors QM1, QM2 is not shown. Bias may be fixed or variable.

First series-coupled feedback capacitor CF1 and feedback resistor RF1 and second series-coupled feedback capacitor CF2 and feedback resistor RF2 each provide negative current feedback. In other embodiments, these negative feedbacks may comprise other components in the same or different configurations. These negative feedbacks may be controlled variable feedbacks that vary in any one or more of a variety of ways described by U.S. Pat. No. 8,456,237, entitled "Low Noise Variable Gain Amplifier Utilizing Variable Feedback Techniques with Constant Input/Output Impedance." As explained therein, input and output impedance of differential feedback amplifier 200 may vary with changes in gain, requiring correction. Changes in gain of differential feedback amplifier 200 may occur, for example, due to changes in one or more of bias (not shown) or variation of variable components. Accordingly, in embodiments with variable feedback, variable feedback may be controlled to match the input and output impedances of differential feedback amplifier 200 as closely as possible to source and load impedances, ZS, ZL.

First main emitter feedback resistor RME1 and second main emitter feedback resistor RME2 are emitter degeneration resistors that provide negative voltage feedback. In other embodiments, these negative feedbacks may comprise other components, e.g., emitter degeneration inductors, in the same or different configurations. These negative feedbacks may be controlled variable feedbacks that vary in any one or more of a variety of ways described by U.S. Pat. No. 8,456,237, entitled "Low Noise Variable Gain Amplifier Utilizing Variable Feedback Techniques with Constant Input/Output Impedance."

Main emitter current-limiting resistor RME3 limits the total current flowing in differential feedback amplifier 200. In other embodiments, emitter current-limiting resistor RME3 may be eliminated or implemented by other components, such as an emitter degeneration inductor.

First and second pull-up chokes LUP1, LUP2 pull-up first and second differential outputs OUT1, OUT2 to supply voltage VCC. High quality factor (QF) inductors may improve linearity performance of differential feedback amplifier 200. Pull-up inductors, pull-up resistors, active loads or any circuit that provides high impedance may be used in other embodiments.

All resistors described herein, such as but not limited to first and second main emitter feedback resistors RME1, RME2, first and second feedback resistors RF1, RF2 and current limiting resistor RME3, may be implemented with integrated thin film metal resistors, polysilicon resistors, junction resistors, FET resistors, diffusion resistors, other integrated circuit technology resistors, discrete resistors and/or any combination thereof. If variable, these resistor values may be controlled by digital or analog techniques, including, but not limited to, a plurality of switches (e.g. MOSFET switches) that switch a plurality of impedances (e.g. fixed resistors) in and out of the variable feedback in response to a control code word.

All capacitors described herein, including first and second feedback capacitors CF1, CF2 may be implemented with a MOS capacitor, a metal-insulator-metal (MIM) capacitor, other integrated circuit technology capacitors or discrete capacitors. All inductors described herein, including first and second pull-up chokes LUP1, LUP2, may be implemented with integrated circuit technology inductors, packaging bondwire inductors or discrete inductors depending on the magnitude of the inductor.

Figure 3:
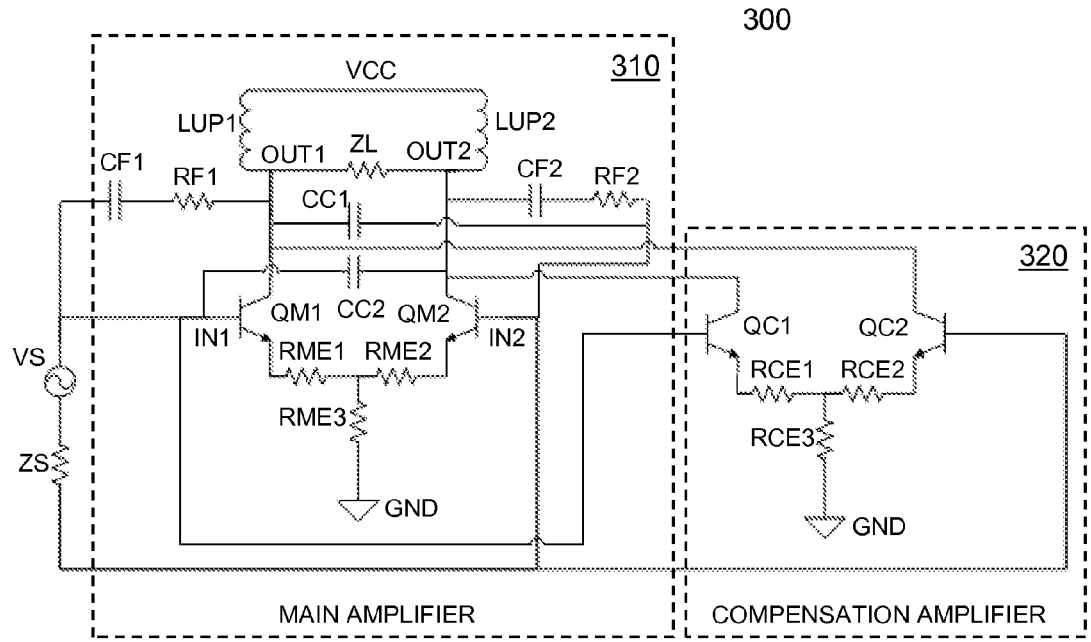
FIG. 3 illustrates an exemplary matched-impedance feedback amplifier with compensation in accordance with an embodiment of the invention.
Figure 4:
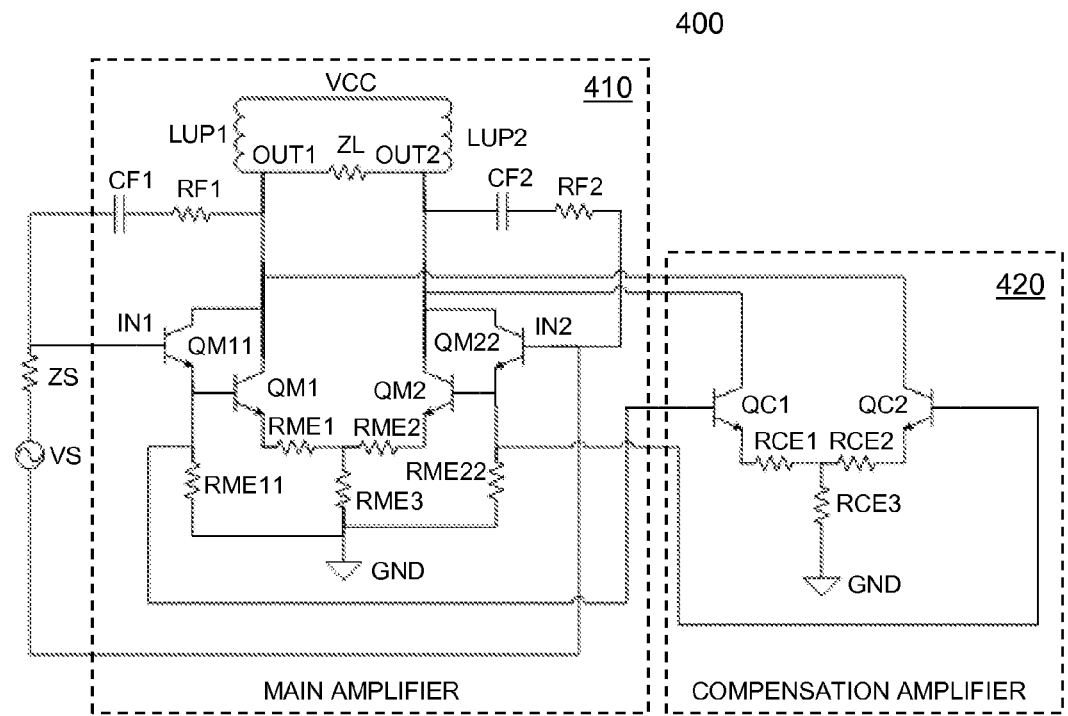
FIG. 4 illustrates an exemplary matched-impedance feedback amplifier with compensation in accordance with an embodiment of the invention.
Figure 6:
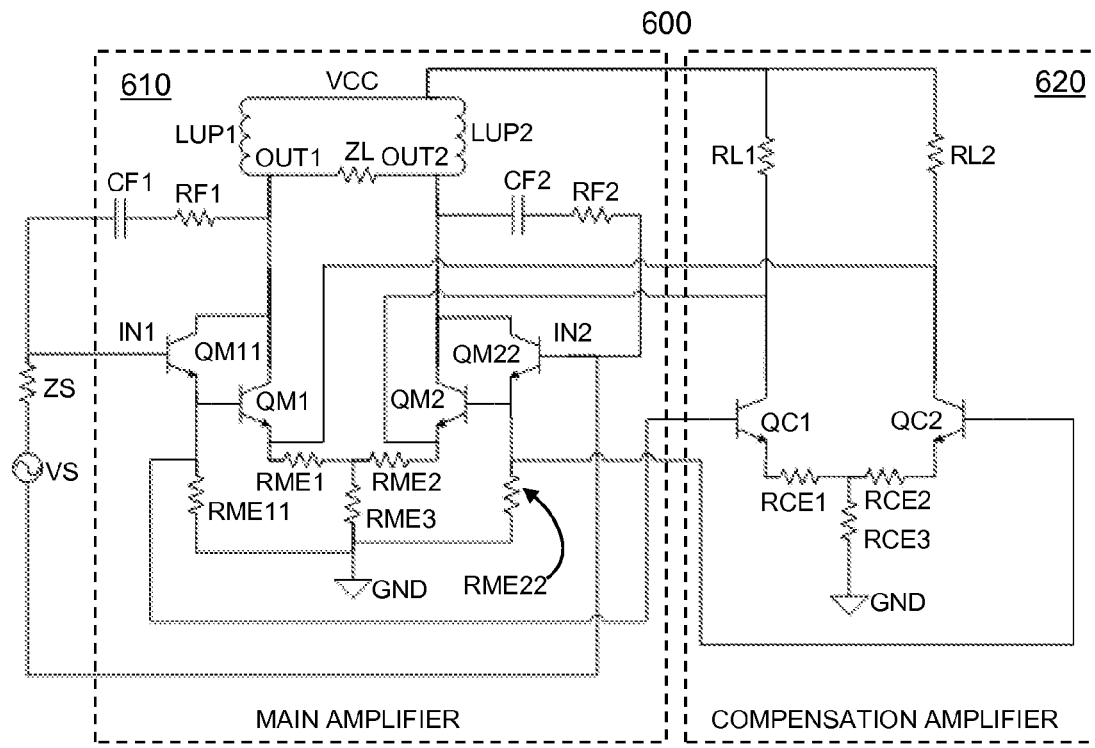
FIG. 6 illustrates an exemplary matched-impedance feedback amplifier with compensation in accordance with an embodiment of the invention.

The foregoing description, including variations in components and architecture, of differential feedback amplifier 200 applies equally well to the description of differential feedback amplifier embodiments illustrated in FIGS. 3, 4 and 6 discussed below. Differential feedback amplifier 200 improves several problems with conventional amplifier 100 illustrated in FIG. 1. FIGS. 3, 4 and 6 illustrate additional power consumption and linearity improvements to differential feedback amplifier 200 to render it substantially superior to conventional amplifiers, such as conventional amplifier 100.

FIG. 3 illustrates an exemplary matched-impedance feedback amplifier with compensation in accordance with an embodiment of the invention. Differential feedback amplifier 300 comprises main amplifier 310 and compensation amplifier 320. The difference between differential feedback amplifier 300 and differential feedback amplifier 200 is the addition of compensation amplifier 320 and, for further linearity improvement at relatively high frequency, cross-coupled capacitors CC1, CC2 added to main amplifier 310.

First cross-coupled capacitor CC1 is coupled between second differential input IN2 and first differential output OUT1. Second cross-coupled capacitor CC2 is coupled between first differential input IN1 and second differential output OUT2. First and second cross-coupled capacitors CC1, CC2 extend linearity performance at higher frequencies. First and second cross-coupled capacitors CC1, CC2 avoid the frequency range limitations created by base resistors RB1, RB2 in conventional differential amplifier 100.

Compensation amplifier 320 comprises first compensation transistor QC1, second compensation transistor QC2, first compensation emitter feedback resistor RCE1, second compensation emitter feedback resistor RCE2 and compensation emitter current-limiting resistor RCE3.

First compensation transistor QC1, and specifically a base terminal of this npn BJT, is coupled to first differential input IN1, which is also the base of first main transistor QM1. Second compensation transistor QC2, and specifically a base terminal of this npn BJT, is coupled to second differential input IN2, which is also the base of second main transistor QM2.

In this embodiment, coupling between the base of first compensation transistor QC1 and first main transistor QM1 and between the base of second compensation transistor QC2 and second main transistor QM2 is direct coupling, although it may be direct or indirect coupling in other embodiments. In some embodiments, for example, DC blocking capacitors may be coupled between the base of first compensation transistor QC1 and first main transistor QM1 and between the base of second compensation transistor QC2 and second main transistor QM2 in order to permit independent bias control of main amplifier 310 and compensation amplifier 320, as opposed to joint bias control of first and second main transistors QM1, QM2 and first and second compensation transistors QC1, QC2. Although some embodiments require bias, bias generation circuitry is not shown. Bias may be fixed or variable. As indicated, biasing of main amplifier 310 and compensation amplifier 320 may be joint or separate, fixed or variable. If separate, such as in the case of a DC blocking capacitor between base nodes of main and compensation transistors, multiple bias generation circuits may be necessary Some embodiments of the invention may implement a variable bias in order to expand linearity for a wider range of input signal levels. Bias current may be varied by detecting the output signal level at first and second differential outputs OUT1, OUT2 and adjusting bias current provided to first and second main transistors QM1, QM2 and first and second compensation transistors QC1, QC2 based on the detected signal level to expand the input signal level range.

First compensation transistor QC1, and specifically its collector terminal, is coupled to second differential output OUT2, which is also the collector of second main transistor QM2. Second compensation transistor QC2, and specifically its collector terminal, is coupled to first differential output OUT1, which is also the collector of first main transistor QM1. Note that this cross terminal connection effectively reverses the polarity of the output of compensation amplifier 320 relative to the output of main amplifier 310, which results in subtraction of the output of compensation amplifier 320 from the output of main amplifier 310. In this embodiment, coupling between the outputs (in this example the collectors) of first compensation transistor QC1 and first main transistor QM1 and between the outputs of second compensation transistor QC2 and second main transistor QM2 is direct coupling, although it may be direct or indirect coupling in other embodiments. In some embodiments, for example, AC coupling capacitors may be coupled between the outputs of first compensation transistor QC1 and first main transistor QM1 and between the outputs of second compensation transistor QC2 and second main transistor QM2.

First compensation transistor QC1, and specifically its emitter terminal, is coupled to a first terminal of first compensation emitter feedback resistor RCE1 while second compensation transistor QC2, and specifically its emitter terminal, is coupled to a first terminal of second compensation emitter feedback resistor RCE2. The second terminals of first and second compensation emitter feedback resistors RCE1, RCE2 are coupled together. First and second compensation emitter feedback resistors RCE1, RCE2 provide negative voltage feedback. Compensation current limiting resistor RCE3 is coupled between ground and the second terminals of first and second compensation emitter feedback resistors RCE1, RCE2. Ground GND may be signal, Earth, chassis or other ground and may also be referred to as common or return. Only passive components without an active tail current source are coupled to the emitters of transistors in main amplifier 310 and compensation amplifier 320, i.e., no active tail current source is utilized.

Consistent with first and second main transistors QM1, QM2, first and second compensation transistors QC1, QC2 are each shown as a bipolar junction transistor (BJT) having a base, collector and emitter. However, in other embodiments, consistent with first and second main transistors QM1, QM2, each of first and second compensation transistors QC1, QC2 can be any bipolar device, e.g., BJT or heterojunction bipolar transistor (HBT), a metal oxide field effect transistor (MOSFET) device, metal semiconductor field effect transistor (MESFET) device or other transconductor or transistor technology device. Such alternative devices may require alternative configurations other than the configuration illustrated in FIG. 3.

First compensation emitter feedback resistor RCE1 and second compensation emitter feedback resistor RCE2 are emitter degeneration resistors that provide negative voltage feedback. In other embodiments, these negative feedbacks may comprise other components, e.g., emitter degeneration inductors, in the same or different configurations. These negative feedbacks may be controllable variable feedbacks that vary in any one or more of a variety of ways described by U.S. Pat. No. 8,456,237, entitled "Low Noise Variable Gain Amplifier Utilizing Variable Feedback Techniques with Constant Input/Output Impedance."

Compensation emitter current-limiting resistor RCE3 limits the total current flowing in compensation amplifier 320. Unlike conventional differential amplifier 100, active tail current sources are not used because they cause poor noise performance and consume additional voltage headroom. Main emitter current-limiting resistor RME3 and compensation emitter current-limiting resistor RCE3 avoid this problem. In other embodiments, both main emitter current-limiting resistor RME3 and compensation emitter current-limiting resistor RCE3 may be eliminated or implemented by other components, such as an emitter degeneration inductor. However, this alternative may be dependent on voltage headroom and common-mode rejection ratio (CMRR) requirements. Emitter degeneration inductors may be implemented by on-chip inductors, packaging parasitic components or by external inductors.

As previously discussed with regard to differential feedback amplifier 200, input and output impedance matching and the gain for main amplifier 300 are determined by properly selecting values for first and second feedback resistors RF1, RF2 and first and second emitter feedback resistors RME1, RME2. As first and second feedback resistors RF1, RF2 increase, the input and output impedance and gain of main amplifier 310 increase, albeit at different rates. As first and second feedback resistors RF1, RF2 decrease, the input and output impedance and gain of main amplifier 310 decrease, albeit at different rates. These increases and decreases can be compensated by selection or adjustment of first and second emitter feedback resistors RME1, RME2 and compensation emitter current-limiting resistor RCE3. As first and second emitter feedback resistors RME1, RME2 decrease, input and output impedances decrease while gain increases, albeit at different rates. As first and second emitter feedback resistors RME1, RME2 increase, input and output impedances increase while gain decreases, albeit at different rates. Thus, together these current and voltage feedback components in main amplifier 310 may be selected and/or adjusted to obtain the desired gain and input and output impedances.

The gain of compensation amplifier 320 may be considerably less than the gain of main amplifier 310. For example, while the gain of main amplifier 310 may be 16 dB or 19 dB, the gain of compensation amplifier may be 0 dB (i.e. unity gain), more or less (i.e., positive or negative dB gain). Accordingly, the size of components in compensation amplifier 320 may be substantially different relative to the size of components in main amplifier 310. For example, in one embodiment, emitter area of a BJT implementation of first and second main transistors QM1, QM2 may be approximately 200 $\mu m^2$ while emitter area of a BJT implementation of first and second compensation transistors QC1, QC2 may be approximately ten times smaller at 20 $\mu m^2$. As a result of compensation amplifier 320 having much smaller gain than main amplifier 310, a much larger amount of distortion than signal is generated by compensation amplifier 320 to subtract from main amplifier 310. Very low gain of compensation amplifier 320 ensures low power consumption and avoidance of gain degradation of main amplifier 310. Generally, the higher the current consumption in main amplifier 310, the higher the current consumption in compensation amplifier 320 to ensure proportional generation of distortion by compensation amplifier 320.

Based on the component values of main amplifier 310, first and second compensation emitter feedback resistors RCE1, RCE2 and compensation emitter current-limiting resistor RCE3 are selected or adjusted to generate distortion with the objective of canceling all distortion in main amplifier 310 in order to improve the linearity performance of main amplifier 310. Similar to the discussion of gain and impedance determination by selection of feedback components in main amplifier 310, larger values of first and second compensation emitter feedback resistors RCE1, RCE2 will decrease the gain of compensation amplifier 320. Since the gain of compensation amplifier 320 is much smaller than the gain of main amplifier 310, the value of first and second compensation emitter feedback resistors RCE1, RCE2 may be considerably larger than the value of first and second main emitter feedback resistors RME1, RME2. For example, in one embodiment, the value of first and second main emitter feedback resistors RME1, RME2 may be approximately 5 Ohms while the value of first and second compensation emitter feedback resistors RCE1, RCE2 may be ten times larger at 50 Ohms. Substantially higher values of first and second compensation emitter feedback resistors RCE1, RCE2 ensures much more distortion than signal is generated by compensation amplifier 320.

In an exemplary embodiment, components in differential feedback amplifier 300 may have the values with the current consumption and linearity performance indicated below in Table 1.

TABLE 1

| Component/Performance | Value |
|---|---|
| VCC | 5 V |
| Gain | 16 dB |
| VS | less than −13 dBm (input power) |
| ZS | 50 Ohm |
| VL | 0 to 3 dBm (output power) |
| ZL | 200 Ohm |
| LUP1,2 | 270 nH |
| CF1,2 | 20 pF |
| RF1,2 | 420 Ohm |
| CC1,2 | 0.3 pF |
| QM1,2 emitter area | ≈200 $\mu m^2$ |
| QC1,2 emitter area | ≈20 $\mu m^2$ |
| RME1,2 | 5 Ohm |
| RCE1,2 | 50 Ohm |
| RME3 | 0 Ohm |
| RCE3 | 90 Ohm |
| Main current consumption | 75 mA total |

TABLE 1-continued

| Component/Performance | Value |
| --- | --- |
| Comp. current consumption | 2.7 mA total |
| Linearity (Output IP3) | +40 dBm (50 to 640 MHz) simulation<br>46 dBm peak at 200 MHz |

Table 1 performance indicators demonstrate that differential amplifiers in accordance with the invention provide substantial performance improvements over state-of-the-art amplifiers. Unlike conventional amplifier 100, differential feedback amplifier 300 has matched input and output impedance and precise gain setting through the current and voltage feedbacks in addition to improved power consumption, noise and linearity performance. For example, while a 16 dB gain state-of-the-art differential amplifier consumes 100 mA at 5 Volts with a peak output IP3 of 36 dBm for an input signal frequency of 200 MHz, a 16 dB gain differential amplifier embodying the invention, such as the embodiment shown in FIG. 3 having values and performance specified in Table 1, consumes 77.7 mA at 5 Volts with a peak output IP3 of 46 dBm for an input signal frequency of 200 MHz as well as sustained 40+dBm output IP3 performance over a wide frequency range of 50 to 640 MHz. In other words, some embodiments of a differential amplifier embodying the invention consume less than 2 mA at 5 Volts or 10 mW power consumption per 1 mW in output IP3 performance at 46 dBm peak and sustained 40+dBm output IP3 performance over a wide frequency range of 50 to 640 MHz. Conventional amplifiers cannot achieve this power consumption to performance ratio.

In Table 1, input voltage signal VS and output voltage signal VL are expressed in terms of power. For example, with an input impedance of 50 Ohms, in one embodiment an input signal VS less than −13 dBm, may have an amplitude less than 7 mV. In this embodiment, input signal VS levels less than −13 dBm may produce optimum linearity, although variable bias may increase the range of input signal levels for optimum linearity performance. In one embodiment, such a variable bias scheme resulted in the input compression point increasing by approximately 2 dB and input signal level range expanding by approximately 4 dB for 40+dBm output IP3 linearity performance.

In a differential feedback amplifier 300 having component values and performance specified in Table 1, the performance contribution of first and second cross-coupled capacitors CC1, CC2 is increasing linearity performance at higher frequencies. Specifically, the presence of first and second cross-coupled capacitors CC1, CC2 increases output IP3 by 5 dBm at 400 MHz and expands the frequency range above 40 dBm output IP3 from 300 to 640 MHz compared to performance of differential feedback amplifier 300 without first and second cross-coupled capacitors.

The foregoing description, including variations in components and architecture, of differential feedback amplifier 300 applies equally well to the description of differential feedback amplifier embodiments illustrated in FIGS. 4 and 6 discussed below. Differential feedback amplifier 300 substantially improves several problems with conventional amplifiers, such as conventional amplifier 100 illustrated in FIG. 1, and substantially improves performance of differential feedback amplifier 200 illustrated in FIG. 2. FIGS. 4 and 6 illustrate additional alternatives or improvements to differential feedback amplifier 300. Note that first and second cross-coupled capacitors CC1, CC2 are not shown in FIGS. 4 and 6 for clarity, but they may be added to improve linearity performance over a wider frequency range.

FIG. 4 illustrates an exemplary matched-impedance feedback amplifier with compensation in accordance with an embodiment of the invention. Differential feedback amplifier 400 comprises main amplifier 410 and compensation amplifier 420. The difference between differential feedback amplifier 400 and differential feedback amplifier 300 is the conversion of first and second main transistors QM1, QM2 into Darlington pairs, which adds first and second Darlington transistors QM11, QM22 and first and second Darlington emitter resistors RME11, RME22 and causes a reconfiguration of connections to the base of first and second main transistors QM1, QM2 and first and second compensation transistors QC1, QC2. A first Darlington pair comprises first Darlington input transistor QM11, which may be referred to as first Darlington input transistor QM11, and first main transistor QM1, which may be referred to in FIGS. 4 and 6 as first Darlington output transistor QM1. A second Darlington pair comprises second Darlington input transistor QM22, which may be referred to as second Darlington input transistor QM22, and second main transistor QM2, which may be referred to in FIGS. 4 and 6 as second Darlington output transistor QM2.

In this Darlington configuration, the base of first main transistor QM1 is coupled to the emitter of first Darlington transistor QM11 instead of being coupled to first differential input IN1. Likewise, the base of second main transistor QM2 is coupled to the emitter of second Darlington transistor QM22 instead of being coupled to second differential input IN2. There is a similar change in connection for first and second compensation transistors QC1, QC2. While the base of first compensation transistor QC1 is still coupled to base of first main transistor QM1, it is now coupled to the emitter of first Darlington transistor QM11, instead of first differential input IN1. Likewise, while the base of second compensation transistor QC2 is still coupled to base of second main transistor QM2, it is now coupled to the emitter of second Darlington transistor QM22, instead of second differential input IN2. In essence, the base of first main transistor QM1 and the base of first compensation transistor QC1 receive the input signal VS coupled to first differential input IN1 after it has been amplified by first Darlington transistor QM11 and first main transistor QM1 and first compensation transistor QC1 will amplify it again for cumulative amplification. Similarly, the base of second main transistor QM2 and the base of second compensation transistor QC2 receive the input signal VS coupled to second differential input IN2 after it has been amplified by second Darlington transistor QM22 and second main transistor QM2 and second compensation transistor QC2 will amplify it again for cumulative amplification.

Accordingly, since first and second Darlington input transistors QM11, QM22 are the first to amplify differential input signal VS, the base of first Darlington input transistor QM11 is coupled to first differential input IN1 while the base of second Darlington input transistor QM11 is coupled to second differential input IN2. The collector of first Darlington input transistor QM11 is coupled to the collector of first Darlington output transistor QM1, the collector of second compensation transistor QC2 and first differential output OUT1. The collector of second Darlington input transistor QM22 is coupled to the collector of second Darlington output transistor QM2, the collector of first compensation transistor QC1 and second differential output OUT2. In an alternative embodiment, the collectors of first and second Darlington input transistors QM11, QM22 may be coupled to power supply VCC. In addition to being coupled to the base of first Darlington output transistor QM1, the emitter of first Darlington input transistor QM11 is coupled to a first terminal of first Darlington emitter resistor RME11, whose second terminal is coupled to ground. In addition to being coupled to the base of second Darlington output transistor QM2, the emitter of second Darlington input transistor QM22 is coupled to a first terminal of second Darlington emitter resistor RME22, whose second terminal is coupled to ground.

Conversion of first and second main transistors QM1, QM2 into Darlington pairs increases the current gain of differential amplifier 300 while reducing the noise figure of differential amplifier 300. For example, in one embodiment where component values of differential feedback amplifier 400 include first and second main emitter feedback resistors RME1, RME2 at 4.5 Ohms, first and second compensation emitter feedback resistors RCE1, RCE2 at 45 Ohms and first and second feedback resistors RF1, RF2 at 650 Ohms, resulting in current consumption of 70 mA by main amplifier 410 and 1.8 mA by compensation amplifier 420, the noise figure decreases 0.5 dB compared to differential feedback amplifier 300.

In an exemplary embodiment, components in differential feedback amplifier 400 may have the values with the current consumption and linearity performance indicated below in Table 2.

TABLE 2

| Component/Performance | Value |
|---|---|
| VCC | 5 V |
| Gain | 19 dB |
| VS | less than −13 dBm (input power) |
| ZS | 50 Ohm |
| VL | 0 to 3 dBm (output power) |
| ZL | 200 Ohm |
| LUP1,2 | 820 nH |
| CF1,2 | 52 pF |
| RF1,2 | 650 Ohm |
| CC1,2 | 0.3 pF |
| QM1,2 emitter area | ≈200 μm² |
| QM11,22 emitter area | ≈80 μm² |
| QC1,2 emitter area | ≈4 μm² |
| RME1,2 | 4.5 Ohm |
| RME11,22 | 220 Ohm |
| RCE1,2 | 45 Ohm |
| RME3 | 0 Ohm |
| RCE3 | 110 Ohm |
| Main current consumption | 70 mA total Darlington Pair |
| Comp. current consumption | 1.8 mA total |
| Linearity (Output IP3) | +40 dBm (50 to 640 MHz) simulation 47 dBm peak at 200 MHz |

Table 2 performance indicators demonstrate that differential amplifiers in accordance with the invention provide substantial performance improvements over state-of-the-art amplifiers. Unlike conventional amplifier 100, differential feedback amplifier 400 has matched input and output impedance and precise gain setting through the current and voltage feedbacks in addition to improved power consumption, noise and linearity performance. For example, while a 19 dB gain state-of-the-art differential amplifier consumes 100 mA at 5 Volts with a peak output IP3 of 36 dBm for an input signal frequency of 200 MHz, a 19 dB gain differential amplifier embodying the invention, such as the embodiment shown in FIG. 4 having values and performance specified in Table 2, consumes 71.8 mA at 5 Volts with a peak output IP3 of 47 dBm for an input signal frequency of 200 MHz as well as sustained 40+dBm output IP3 performance over a wide frequency range of 50 to 640 MHz. A differential amplifier embodying the invention consumes less than 2 mA per 1 mW in output IP3 performance while also substantially increasing linearity, as measured by output IP3, e.g., from 36 to 47 dBm peak as well as sustained 40+dBm output IP3 performance over a wide frequency range of 50 to 640 MHz. Conventional amplifiers cannot achieve this power consumption to performance ratio.

The foregoing description, including variations in components and architecture, of differential feedback amplifier 400 applies equally well to the description of differential feedback amplifier embodiments illustrated in FIG. 6 discussed below. Differential feedback amplifier 400 substantially improves several problems with conventional amplifiers, such as conventional amplifier 100 illustrated in FIG. 1, and substantially improves performance of differential feedback amplifier 200 illustrated in FIG. 2. FIG. 6 illustrates additional alternatives or improvements to differential feedback amplifiers 300 and 400.

Figure 5:
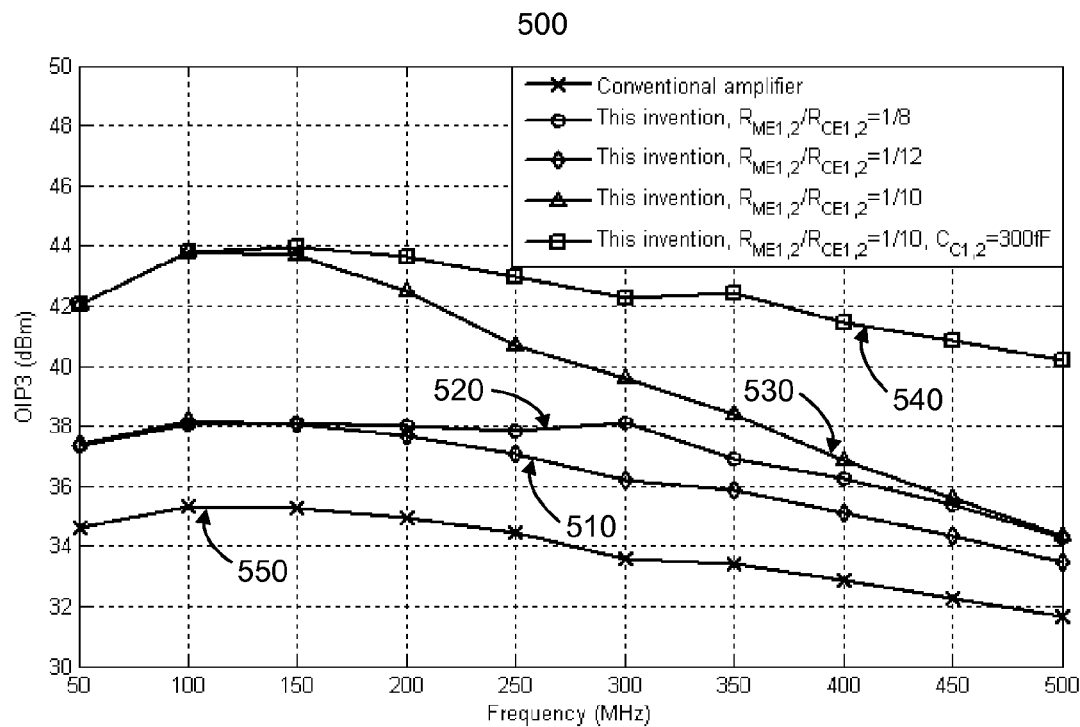
FIG. 5 illustrates output IP3 over a frequency range in accordance with some embodiments of the invention illustrated in FIG. 4.

FIG. 5 illustrates output IP3 over a frequency range in accordance with some embodiments of the invention illustrated in FIG. 4. Output IP3 versus frequency performance plot 500 illustrates comparative performance results for four embodiments of FIG. 4 (i.e. first, second, third and fourth plots 510, 520, 530 and 540) and an embodiment of differential amplifier 200 (i.e. fifth plot 550). First, second, third and fourth plots 510, 520, 530 and 540 provide simulation results. It is notable that the simulation result of plot 530 underestimates the peak IP3 value by approximately 4 dB for an actual implementation of the embodiment in FIG. 4. The frequency range shown in FIG. 5 is 50 to 500 MHz, although the linearity performance remained high across a wider range of frequencies for some embodiments, as shown in Table 2 performance results. Each of four simulated embodiments of FIG. 4 had a main amplifier current consumption of 70 mA and a gain of 19 dB, as shown in Table 2. However, as indicated in FIG. 5, each of the four embodiments had a different configuration. The first embodiment, whose performance is represented by first plot 510, was configured with a ratio of $1/12^{th}$ between first and second main emitter feedback resistors RME1, RME2 and first and second compensation emitter feedback resistors RCE1, RCE2. The second embodiment, whose performance is represented by second plot 520, was configured with a ratio of $1/8^{th}$ between first and second main emitter feedback resistors RME1, RME2 and first and second compensation emitter feedback resistors RCE1, RCE2. The third embodiment, whose performance is represented by third plot 530, was configured with a ratio of $1/10^{th}$ between first and second main emitter feedback resistors RME1, RME2 and first and second compensation emitter feedback resistors RCE1, RCE2. The fourth embodiment, whose performance is represented by fourth plot 540, was configured with a ratio of $1/10^{th}$ between first and second main emitter feedback resistors RME1, RME2 and first and second compensation emitter feedback resistors RCE1, RCE2. Although first and second cross-coupled capacitors are not shown in differential feedback amplifier 400, they were variously not present and present in the four simulations. Only the fourth embodiment, whose performance is represented by fourth plot 540, had cross-coupled capacitors having a value of 0.3 pF or 300 fF, as shown in Table 2 and indicated in FIG. 5. Thus, fourth plot 540 represents output IP3 performance with first and second cross-coupled capacitors CC1, CC2 in differential feedback amplifier 400.

First, second, third and fourth plots 510, 520, 530, 540 in FIG. 5 make clear several advantages provided by embodiments of the invention. First, second, third and fourth plots 510, 520, 530, 540 all exhibit better linearity performance than differential amplifier 200. Optimizing the ratio between first and second main emitter feedback resistors RME1, RME2 and first and second compensation emitter feedback resistors RCE1, RCE2 plays an important role in linearity performance. Third and fourth plots 530, 540 illustrate the advantage of selecting the most effective ratio between first and second main emitter feedback resistors RME1, RME2 and first and second compensation emitter feedback resistors RCE1, RCE2. Having the most effective ratio between first and second main emitter feedback resistors RME1, RME2 and first and second compensation emitter feedback resistors RCE1, RCE2, third and fourth embodiments 530, 540 illustrate high (+40 dBm) output IP3 performance over several hundred Megahertz. Of course the most effective ratio may vary between embodiments. Fourth plot 540 relative to third plot 530 illustrates the further advantage of having first and second cross-coupled capacitors CC1, CC2 because they extend high performance linearity at higher frequencies. Specifically, the presence of first and second cross-coupled capacitors CC1, CC2 increases output IP3 by 5 dBm at 400 MHz and expands the frequency range above 40 dBm output IP3 from 300 to 640 MHz compared to performance of differential feedback amplifier 400 without first and second cross-coupled capacitors CC1, CC2 illustrated in third plot 530.

There are two different qualities of output IP3 performance illustrated in FIG. 5. First, output IP3 is relatively constant, i.e., the rate of change of output IP3 versus the rate of change of frequency is low, and the magnitude of output IP3 is high (+40 dBm). The difference is that these two qualities of output IP3 performance occur over a wider frequency range with the presence of first and second cross-coupled capacitors CC1, CC2.

Various embodiments may be implemented to amplify signals within a particular range of frequencies, e.g., 50-250 MHz, 50-350 MHz, 50-500 MHz. In some embodiments cross-coupled capacitors may be unnecessary. Architecture and component values may be selected for optimal performance over specific frequency ranges. Of course, results may vary between an unlimited number of embodiments.

FIG. 6 illustrates an exemplary matched-impedance feedback amplifier with compensation in accordance with an embodiment of the invention. Differential feedback amplifier 600 comprises main amplifier 610 and compensation amplifier 620. The difference between differential feedback amplifier 600 and differential feedback amplifier 400 is that the output of compensation amplifier 620 (i.e. collectors of first and second compensation transistors QC1, QC2) is subtracted from the emitter nodes of first and second Darlington output transistors QM1, QM2 instead of from the first and second outputs of main amplifier 610, i.e. OUT1, OUT2 or the collector nodes of first and second Darlington output transistors QM1, QM2. As a result of this technique of subtracting distortion from main amplifier 610, compensation amplifier 620 implements first and second pull-up resistors RL1, RL2, although other biasing techniques for first and second compensation transistors QC1, QC2, are possible. This technique also works with first and second main transistors as shown in differential feedback amplifier 300, i.e., without a Darlington pair.

In either a Darlington configuration or a single transistor configuration, the collectors of first and second compensation transistors QC1, QC2 are simply coupled to the emitter nodes of first and second main transistors QM1, QM2 instead of the collector nodes of first and second main transistors QM1, QM2. Additionally, in this embodiment, the collector node of first compensation transistor QC1 is coupled to a first terminal of a first pull-up resistor RL1, where the second terminal is coupled to power supply VCC. Similarly, the collector node of second compensation transistor QC2 is coupled to a first terminal of second pull-up resistor RL2, where the second terminal is coupled to power supply VCC.

Component values for differential feedback amplifier 600 may be similar to those in Table 2, although component values for each of differential feedback amplifiers 300, 400, 600 and the many other embodiments of the invention may vary due to different designs and applications, e.g., operating frequency, gain and output power, etc. requirements. Architecture and component values may differ among embodiments. Each design and implementation of an embodiment may require analyses and experimentation in the normal course of design, simulation and implementation to achieve the best or at least the most acceptable performance in view of design constraints and component tolerances.

Regarding the choice of application of one of differential feedback amplifier 300, 400 and 600, differential feedback amplifier 400 may be superior for low noise and relaxed output power 1 dB compression point (P1 dB) applications while differential feedback amplifier 300 may be superior for moderate noise figure and high P1 dB applications.

Although embodiments illustrate fully differential feedback amplifiers embodiments of the invention may comprise single-ended implementations. A device in accordance with an embodiment of the invention may comprise, for example, a single-ended or differential impedance-matched main amplifier having multiple negative feedbacks coupled to the output of a low-gain, no-gain or negative-gain distortion compensation amplifier having at least one negative feedback. Neither amplifier has an active tail current source. The compensation may consist of generating and subtracting distortion from the main amplifier. Both the main amplifier and compensation amplifier may have negative feedback in the form of one or more emitter degeneration components, such as a resistor or inductor. The main amplifier may have an additional negative feedback coupled between its input and output. Negative feedback and/or bias current may be variable to further increase linearity and dynamic range. Each amplifier may comprise one or more transistors, e.g., single or Darlington BJT, FET, where the main and compensation amplifiers are coupled accordingly to subtract distortion. The compensation amplifier may be biased by the main amplifier or may be biased independent of the main amplifier. Inputs to main and compensation amplifiers may be directly coupled to one another or indirectly coupled through one or more components, e.g. a DC blocking capacitor. Indirect coupling through a DC blocking capacitor enables independent bias control of main and compensation amplifiers. Cross-coupled capacitors and/or pull-up chokes may also improve performance.

Each embodiment illustrated and discussed herein, as well as many other embodiments within the scope of inventions disclosed herein, may be described in a variety of general and specific descriptions with or without using the exact description provided herein. The embodiments presented are not limiting. Rather, they are an introduction to many embodiments falling within the scope of the inventions described herein. A series of descriptions of embodiments of the inventions are provided below. Like the embodiments, these descriptions are not limiting. Rather, these descriptions are simply a few of many ways to generally and specifically describe embodiments within the scope of the inventions disclosed herein.

Many differential amplifier embodiments of the inventions, including the three embodiments presented in FIGS. 3, 4, and 6, are described by a differential feedback amplifier comprising: a main differential amplifier having a main gain and having for each of a first and a second side of the main differential amplifier: [a] a main transistor having a main base coupled to an input and a main collector coupled to an output, [b] an input impedance matching a source impedance and an output impedance matching a load impedance, [c] a first negative feedback comprising a series-coupled resistor and capacitor coupled between the input and the output, [d] a second negative feedback comprising a main emitter degeneration component coupled between a main emitter and ground; and a compensation differential amplifier that generates and subtracts distortion from the main differential amplifier, the compensation differential amplifier having a compensation gain lower than the main gain and having for each of a first and a second side of the compensation differential amplifier: [e] a compensation transistor having a compensation base directly coupled to the main base and a compensation collector coupled to one of the main collector and the main emitter to subtract the distortion; [f] a third negative feedback comprising a compensation emitter degeneration component coupled between a compensation emitter and ground.

As illustrated in the embodiment of FIG. 3 and optional in all embodiments, the main differential amplifier may further have: [g] a first cross-coupled capacitor coupled between a first output and a second input and a second cross-coupled capacitor coupled between a second output and a first input and [h] a first pull-up choke coupled between a first output and a voltage source and a second pull-up choke coupled between a second output and the voltage source.

As illustrated in the embodiments of FIGS. 4 and 6 and optional in all embodiments, [i] the main transistor may comprise a Darlington Pair having a main input transistor and a main output transistor such that the main emitter degeneration component is coupled to an emitter of the main output transistor and the compensation collector is coupled to one of the emitter and a collector of the main output transistor to subtract the distortion.

Many differential amplifier embodiments of the inventions, including the three embodiments presented in FIGS. 3, 4, and 6, are described by a device comprising: a first circuit in a first configuration comprising a first set of components: a first amplifier without an active tail current source having a first gain, a first input, a first output, a first negative feedback and a second negative feedback, the first input configured to be coupled to a source and the first output configured to be coupled to a load where an impedance of the first input matches an impedance of the source and an impedance of the first output matches an impedance of the load; and a second circuit in a second configuration comprising a second set of components: a second amplifier without an active tail constant current source having a second gain, a second input, a second output and a third negative feedback, the second gain is less than the first gain, the second circuit coupled to provide compensation to the first circuit.

As illustrated in the embodiments of FIGS. 3, 4 and 6 and optional in all embodiments, [a] the compensation comprises generating and subtracting distortion from the first circuit; [b] the first and second circuits are differential circuits having first and second sides and the first and second set of components each comprise a first and second set of components, respectively, on the first and second sides of the first and second circuits; [c] the first and second circuits are configured to consume less than 2 mA per 1 mW in output IP3 performance of at least 40 dBm over a frequency range of several hundred Megahertz or even at least 500 MHz; [d] the first negative feedback is coupled between the first input and first output; [e] the first negative feedback comprises a series-coupled first resistor and first capacitor; [f] the second and third negative feedbacks each comprise emitter degeneration; [g] the second input and second output are coupled to the first circuit; [h] the first amplifier comprises a first transistor and the second amplifier comprises a second transistor, wherein a base of the second transistor is coupled to a base of the first transistor; [i] the coupling between the base of the first input transistor and the base of the second input transistor is direct coupling; and [j] the first configuration further comprises a pull-up choke coupled between a first output and a voltage source.

As illustrated in the embodiments of FIGS. 4 and 6 and optional in all embodiments, [k] the first transistor comprises a Darlington Pair having a first input transistor coupled to a first output transistor, wherein a base of the second transistor is coupled to a base of the first output transistor; [l] the coupling between the base of the second transistor and the base of the first output transistor is direct coupling.

As illustrated in the embodiment of FIG. 3 and optional in all embodiments, [m] the first configuration further comprises capacitors cross-coupled between the main amplifier's first output and second input and between second output and first input.

Some examples of alternatives that are optional in all embodiments, include but are not limited to: [n] the first resistor and an emitter degeneration resistor in the first circuit are controlled to vary to provide variable negative feedback; [o] the first circuit further comprising a variable bias current generation loop that detects a signal level at the first output and uses the signal level to vary a bias current provided to the first amplifier and the second amplifier; [p] a DC blocking capacitor is coupled between the base of the first input transistor and the base of the second input transistor enabling independent bias control for the first and second amplifiers.

There are many design, cost and/or performance advantages provided by embodiments of the invention relative to conventional feedback amplifiers. Linearity is improved and power consumption is reduced in a low noise, impedance matched amplifier by using a feed-forward linearization technique involving negative feedbacks and distortion compensation without active tail current sources. This technique provides low power requirements, low distortion, e.g., third-order intermodulation (IM3), and high linearity, e.g., output third order intercept point (i.e., IP3 or TOI), resulting in high signal-to-noise ratio (SNR) and high quality of service (QoS). No additional stages are required to match input and output impedances. Devices and equipment, such as radio frequency (RF) to intermediate frequency (IF) mixers in cellular base station equipment in the field of wireless communication, that utilize amplifiers implementing these high linearity, low-distortion, low-power amplification techniques may simultaneously improve their sensitivity, dynamic range, power consumption, heat dissipation, volume and packaging.

Differential amplifiers in accordance with the invention provide substantial performance improvements over state-of-the-art amplifiers. For example, while a 16 dB gain state-of-the-art differential amplifier consumes 100 mA at 5 Volts with a peak output IP3 of 36 dBm for an input signal frequency of 200 MHz, a 16 dB gain differential amplifier embodying the invention consumes 77.7 mA at 5 Volts with a peak output IP3 of 46 dBm for an input signal frequency of 200 MHz. In some embodiments, a differential amplifier embodying the invention consumes less than 2 mA at 5 Volts or 10 mW power consumption per 1 mW in output IP3 performance while also substantially increasing peak and sustained linearity, as measured by output IP3, e.g., from 36 to 46 dBm peak as well as sustained 40+dBm output IP3 performance over a wide frequency range of 50 to 640 MHz. Noise may be reduced by eliminating active tail current sources. Conventional amplifiers cannot achieve this power consumption to peak and sustained performance ratio.

A device, as defined herein, is a machine or manufacture as defined by 35 U.S.C. §101. A device may comprise, for example but not limited to, a circuit, amplifier, mixer, intermediate frequency (IF) device, radio frequency (RF) device, wireless device, communications device, radio system, receiver, transmitter, transceiver, cellular base station equipment and other communications and wireless infrastructure equipment, etc. For example, embodiments of the invention can be implemented in one or more IF and RF stages of receivers, transmitters and transceivers.

Techniques described herein may be implemented in hardware (digital and/or analog) or a combination of hardware, software and/or firmware. Techniques described herein may be implemented in one or more components. Embodiments of the invention may comprise computer program products comprising logic (e.g., in the form of program code or software as well as firmware) stored on any computer useable medium, which may be integrated in or separate from other components. Such program code, when executed in one or more processors, causes a device to operate as described herein. Devices in which embodiments may be implemented may include storage, such as storage drives, memory devices, and further types of computer-readable media. Examples of such computer-readable media include, but are not limited to, a hard disk, a removable magnetic disk, a removable optical disk, flash memory cards, digital video disks, random access memories (RAMs), read only memories (ROM), and the like. In greater detail, examples of such computer-readable media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable media may, for example, store computer program logic, e.g., program modules, comprising computer executable instructions that, when executed, provide and/or maintain one or more aspects of functionality described herein with reference to FIGS. 2-6, as well as any and all components, steps and functions therein and/or further embodiments of the present invention described herein.

Proper interpretation of subject matter described herein and claimed hereunder is limited to patentable subject matter under 35 U.S.C. §101. Subject matter described in and claimed based on this patent application is not intended to and does not encompass unpatentable subject matter. As described herein and claimed hereunder, a method is a process defined by 35 U.S.C. §101. As described herein and claimed hereunder, each of a circuit, device, converter, apparatus, machine, system, computer, module, media and the like is a machine and/or manufacture defined by 35 U.S.C. §101.

While the present invention has been described with respect to a limited number of embodiments, those skilled in the art will appreciate numerous modifications and variations there from. Embodiments have been presented by way of example only, and not limitation. It will be apparent to persons skilled in the relevant art(s) that various changes in form and details can be made therein without departing from the spirit and scope of the invention. The exemplary appended claims encompass embodiments and features described herein, modifications and variations thereto as well as additional embodiments and features that fall within the true spirit and scope of this present invention.

What is claimed:

1. A differential feedback amplifier comprising:
    a main differential amplifier having a main gain and having for each of a first and a second side of the main differential amplifier: [a] a main transistor having a main base coupled to an input and a main collector coupled to an output, [b] an input impedance matching a source impedance and an output impedance matching a load impedance, [c] a first negative feedback comprising a series-coupled resistor and capacitor coupled between the input and the output, [d] a second negative feedback comprising a main emitter degeneration component coupled between a main emitter and ground; and
    a compensation differential amplifier that generates and subtracts distortion from the main differential amplifier, the compensation differential amplifier having a compensation gain lower than the main gain and having for each of a first and a second side of the compensation differential amplifier: [e] a compensation transistor having a compensation base directly coupled to the main base and a compensation collector coupled to one of the main collector and the main emitter to subtract the distortion; [f] a third negative feedback comprising a compensation emitter degeneration component coupled between a compensation emitter and ground.

2. The differential feedback amplifier of claim 1, the main differential amplifier further having [g] a first cross-coupled capacitor coupled between a first output and a second input and a second cross-coupled capacitor coupled between a second output and a first input and [h] a first pull-up choke coupled between a first output and a voltage source and a second pull-up choke coupled between a second output and the voltage source.

3. The differential feedback amplifier of claim 1, wherein the main transistor comprises a Darlington Pair having a main input transistor and a main output transistor such that the main emitter degeneration component is coupled to an emitter of the main output transistor and the compensation collector is coupled to one of the emitter and a collector of the main output transistor to subtract the distortion.

4. A device comprising:
    a first circuit in a first configuration comprising a first set of components: a first amplifier without an active tail current source having a first gain, a first input, a first output, a first negative feedback and a second negative feedback, the first input configured to be coupled to a source and the first output configured to be coupled to a load where an impedance of the first input matches an impedance of the source and an impedance of the first output matches an impedance of the load; and
    a second circuit in a second configuration comprising a second set of components: a second amplifier without an active tail current source having a second gain, a second input, a second output and a third negative feedback, the second gain is less than the first gain, the second circuit coupled to provide compensation to the first circuit.

5. The device of claim 4, wherein the compensation comprises generating and subtracting distortion from the first circuit.

6. The device of claim 5, wherein the first and second circuits are differential circuits having first and second sides and the first and second set of components each comprise a first and second set of components, respectively, on the first and second sides of the first and second circuits.

7. The device of claim 6, wherein the first and second circuits are configured to consume less than 10 mW power consumption per 1 mW in output IP3 performance of at least 40 dBm over a frequency range of at least 500 MHz.

8. The device of claim 6, wherein the first negative feedback is coupled between the first input and first output.

9. The device of claim 8, wherein the first negative feedback comprises a series-coupled first resistor and first capacitor.

10. The device of claim 9, wherein the second and third negative feedbacks each comprise emitter degeneration.

11. The device of claim 10, wherein the first resistor and an emitter degeneration resistor in the first circuit are controlled to vary to provide variable negative feedback.

12. The device of claim 10, the first circuit further comprising a variable bias current generation loop that detects a signal level at the first output and uses the signal level to vary a bias current provided to the first amplifier and the second amplifier.

13. The device of claim 10, wherein the second input and second output are coupled to the first circuit.

14. The device of claim 13, the first amplifier comprising a first transistor and the second amplifier comprising a second transistor, wherein a base of the second transistor is coupled to a base of the first transistor.

15. The device of claim 14, wherein the coupling between the base of the first input transistor and the base of the second input transistor is direct coupling.

16. The device of claim 14, wherein a DC blocking capacitor is coupled between the base of the first input transistor and the base of the second input transistor enabling independent bias control for the first and second amplifiers.

17. The device of claim 14, the first transistor comprising a Darlington Pair having a first input transistor coupled to a first output transistor, wherein a base of the second transistor is coupled to a base of the first output transistor.

18. The device of claim 17, wherein the coupling between the base of the second transistor and the base of the first output transistor is direct coupling.

19. The device of claim 13, the first configuration further comprising capacitors cross-coupled between a first output and a second input and between a second output and a first input.

20. The device of claim 19, the first configuration further comprising a pull-up choke coupled between a first output and a voltage source.

* * * * *